United States Patent [19]
Gonzales et al.

[11] Patent Number: 6,090,685
[45] Date of Patent: Jul. 18, 2000

[54] METHOD OF FORMING A LOCOS TRENCH ISOLATION STRUCTURE

[75] Inventors: Fernando Gonzales; Mike Violette; Nanseng Jeng; Aftab Ahmad, all of Boise, Id.; Klaus Schuegraf, Chandler, Ariz.

[73] Assignee: Micron Technology Inc., Boise, Id.

[21] Appl. No.: 08/916,475

[22] Filed: Aug. 22, 1997

[51] Int. Cl.$^7$ .................................................. H01L 21/76
[52] U.S. Cl. ......................... 438/425; 438/424; 438/426; 438/435; 148/DIG. 50
[58] Field of Search ................................... 438/424, 425, 438/426, 427, 435; 148/DIG. 50

[56] References Cited

U.S. PATENT DOCUMENTS

| | | | |
|---|---|---|---|
| 4,965,221 | 10/1990 | Dennison et al. | 437/70 |
| 5,096,848 | 3/1992 | Kawamura | 437/67 |
| 5,436,190 | 7/1995 | Yang et al. | 437/67 |
| 5,756,389 | 5/1998 | Lim et al. | 438/425 |

*Primary Examiner*—Trung Dang
*Attorney, Agent, or Firm*—Workman, Nydegger + Seeley

[57] ABSTRACT

A semiconductor structure pad oxide layer is enlarged by local oxidation of silicon to form a field oxide. An etchback causes the thinnest portions of the field oxide to recede such that a portion of the semiconductor substrate is exposed. An etch through the exposed portion of the semiconductor substrate forms a microtrench between the field oxide and the nitride layer with a lateral dimension that is less than that currently achievable by conventional photolithography. The microtrench is then filled by oxide or nitride growth or by deposition of a dielectric material. In another embodiment, formation of the microtrench is carried out as set forth above, but the nitride layer is removed immediately following trench formation. Alternatively, the pad oxide layer is stripped and a new oxide layer is regrown that substantially covers all exposed surfaces of active areas of the semiconductor substrate. The regrown oxide layer will encroach into all exposed surfaces of active areas and will grow also in the microtrench. Alternatively, the pad oxide layer is etched substantially uniformly at regions distant from nitride layer, whereas the etchant concentrates the etch against the nitride layer such that etching is accelerated at this location. Because of accelerated etching at this location, a breach in the pad oxide layer forms before etching of the pad oxide layer has been generally penetrated. The breach has a width of sub-photolithographic limits preparatory to formation of a microtrench thereunder.

48 Claims, 6 Drawing Sheets

METHOD OF FORMING A LOCOS TRENCH ISOLATION STRUCTURE

BACKGROUND OF THE INVENTION

1. The Field of the Invention

The present invention relates to the formation of semiconductor devices. In particular, the present invention relates to the formation of isolation trench structures for semiconductor devices. More particularly, the present invention relates to an inventive method for the formation of an inventive isolation microtrench at the edge of a field oxide region of a semiconductor device.

2. The Relevant Technology

In the microelectronics industry, a substrate refers to one or more semiconductor layers or structures which includes active or operable portions of semiconductor devices. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductor substrates described above.

The term "substrate assembly" is intended herein to mean a semiconductor substrate having one or more layers or structures formed thereon. As such, the substrate assembly may be, by way of example and not by way of limitation, a semiconductor substrate such as, N-well or P-well doped silicon having a gate oxide layer over an active area of the semiconductor substrate, a field oxide layer adjacent to the gate oxide layer, and a microtrench positioned between the gate oxide layer and the field oxide layer.

In the microelectronics industry, the process of miniaturization entails shrinking the size of individual semiconductor devices to make room for more semiconductor devices on a given unit area. With miniaturization, problems of proper isolation between semiconductor devices arise. When miniaturization demands the shrinking of individual devices, isolation structures must also be reduced in size. Attempts to isolate semiconductor devices from each other are currently limited to photolithographic limits of about 0.35 microns for isolation structure widths.

To form an isolation trench on a semiconductor wafer by photolithography, for example, the photoresist mask through which the isolation trench is etched generally utilizes a beam of light, such as ultraviolet (UV) light, to transfer a pattern through an imaging lens from a photolithographic template to a photoresist coating which has been applied to the structural layer being patterned. The pattern of the photolithographic template includes opaque and transparent regions with selected shapes that match corresponding openings and intact portions intended to be formed into the photoresist coating. The photolithographic template is conventionally designed by computer assisted drafting and is of a much larger size than the semiconductor wafer on which the photoresist coating is located. Light is shone through the photolithographic template and is focused on the photoresist coating in a manner that reduces the pattern of the photolithographic template to the size of the photolithographic coating and that develops the portions of the photoresist coating that are unmasked and are intended to remain. The undeveloped portions are thereafter easily removed.

The resolution with which a pattern can be transferred to the photoresist coating from the photolithographic template is currently limited in commercial applications to widths of about 0.35 microns or greater. In turn, the dimensions of the openings and intact regions of the photoresist mask, and consequently the dimensions of the shaped structures that are formed with the use of the photoresist mask, are correspondingly limited. Photolithographic resolution limits are thus a barrier to further miniaturization of integrated circuits. Accordingly, a need exists for an improved method of forming isolation trenches that have a size that is reduced from what can be formed with conventional photolithography.

The photolithography limit and accompanying problems of alignment and contamination are hindrances upon the ever-increasing pressure in the industry to miniaturize. Other problems that occur in isolation trench formation are, with trenches that are deep and wide in comparison to the size of the individual device that the trench is isolating, dielectric material such as thermal silicon oxide that fills the trench tends to encroach upon the active area that the trench is supposed to isolate. Another problem is that wide and deep trenches tend to put a detrimental amount of stress upon the silicon of the active area that leads to defects such as delamination, fracture, and device failure.

Another problem that arises in isolation trench formation under current photolithographic limits is that with the limitations of trench widths, specific defects arise at the upper corners of the active areas. One such defect is called a Kooi corner defect. Removal of a Kooi defect requires growing a sacrificial oxide (SAC) and then subsequently removing it before a gate oxide can be grown over an active area. SAC growth can destructively remove substantially all semiconductive material, such as silicon, down to or near the bottom of the trench that has just been fabricated, thereby neutralizing the effect of trench formation. It would be an advancement in the art to find a method to avoid this defect. At the field edge of a LOCOS in silicon, there is a stress-induced defect upon growth of the LOCOS. The oxide thickness is thinner in a small space and thicker in a large space. Thus, with a small space, there exists difficulty in forming an isolation region because of the potential extent of growth of a LOCOS into the isolation region. A microtrench that avoids both the Kooi defect and the problems associated with growing a LOCOS would therefore be an advancement in the art What is needed is an inventive method of isolation trench formation that avoids the problems of the prior art such as alignment, photolithographic limitations, isolation trench filling that causes stress upon the active areas, and SAC processing that substantially neutralizes the effect of the isolation trench that is formed.

SUMMARY OF THE INVENTION

In a first embodiment of the present invention, an isolation trench is formed in a semiconductor structure. A semiconductor structure consists of a semiconductor substrate, a pad oxide layer, a nitride layer, and a mask that has been used to pattern the nitride layer. The pad oxide layer is enlarged by local oxidation of silicon (LOCOS) to form a field oxide. An etchback is then carried out. The etchback causes a thin portion of the field oxide to recede such that a portion of the semiconductor substrate is exposed. The exposed portion has a lateral dimension that is less than currently achievable dimensions using photolithography. The inventive method etches through the exposed portion of the semiconductor substrate to form a microtrench. The microtrench forms between the field oxide and the nitride layer The microtrench is next filled by oxide or nitride.

Following formation of the filled microtrench, a subsequent oxidation is carried out whereby the field oxide is enlarged. The enlarged field oxide encroaches downwardly into the semiconductor substrate, however, encroachment by the enlarged field oxide laterally into active areas is substantially resisted by the presence of the filled microtrench.

In another embodiment of the present invention, formation of the microtrench is carried out as set forth above, but the nitride layer is removed immediately following microtrench formation. In a first alternative technique of this embodiment, the pad oxide layer is stripped and a new oxide layer is regrown that substantially covers all exposed surfaces of the active areas of the semiconductor substrate. This means that the regrown oxide layer will encroach into all exposed surfaces of active areas that includes the microtrench.

In yet another embodiment of the present invention, microtrench formation is carried out by pattering the nitride layer and then by performing an etch upon the pad oxide layer. Etching of the pad oxide layer is carried out as the pad oxide layer etches substantially uniformly at regions distant from the patterned nitride layer. During the pad oxide layer etch, the etchant concentrates itself against the nitride layer where the nitride layer touches the pad oxide layer such that pad oxide layer etching is accelerated at the interface with the nitride layer. Because of accelerated etching at this location, a breach in the pad oxide layer forms before etching of the pad oxide layer has generally removed all of the pad oxide layer. Control of the inventive etching method allows for the width of the breach to be narrower than an area otherwise achievable by photolithography according to present photolithographic techniques.

Following formation of the breach in the pad oxide layer, a microtrench is etched through the breach into the semiconductor substrate. A cover layer, for example a nitride film, is formed both within the microtrench and upon the nitride layer. A nitride spacer etch is then carried out to remove substantially all of the cover layer except for those portions that are within the microtrench and upon the side walls of nitride layer, thus forming a nitride isolation microtrench. Formation of a field oxide follows and encroachment of oxide into areas protected by the nitride isolation microtrench is resisted.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to formation of isolation microtrenches in a width range that is smaller than that achievable by photolithographic techniques. This technology is particularly useful in fabricating from 64 meg to 4 gig DRAM devices.

Figure 1:
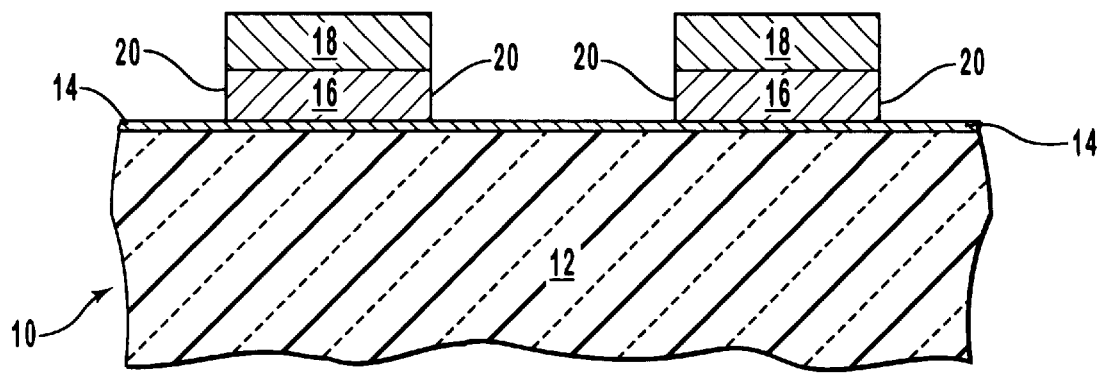
FIG. 1 is an elevational cross-section view of a semiconductor structure that comprises a semiconductor substrate, a pad oxide layer, a patterned nitride layer, and a mask.

In a first embodiment of the present invention illustrated in FIG. 1, a semiconductor structure 10 is shown as having a semiconductor substrate 12, which is by way of non-limiting example an N-doped silicon material. A pad oxide layer 14 on semiconductor substrate 12 acts as a stress reduction barrier. A nitride layer 16 on pad oxide layer 14 has at least one lateral surface 20 thereon, and a mask 18 is also shown as having been used to pattern nitride layer 16. Nitride layer 16 also acts as an oxidation barrier for the portion of semiconductor substrate 12 over which it is disposed. Pad oxide layer 14 is formed of an oxide in the thickness range of from about 30 Å to about 300 Å, preferably in the range of from about 60 Å to about 250 Å, more preferably in the range of from about 90 Å to about 200 Å, and most preferably in the range of less than 200 Å.

Figure 2:
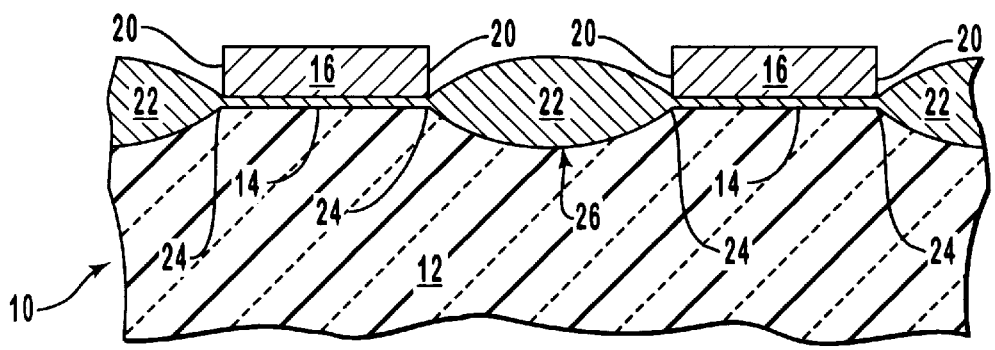
FIG. 2 is an elevational cross-section view of the semiconductor structure depicted in FIG. 1 after further processing, wherein a field oxide has been grown upon exposed portions of the pad oxide layer, thereby substantially enlarging the thickness of the pad oxide layer at regions most distant from the nitride layer, and also thereby leaving a thin portion immediately touching the laterally exposed surface of the nitride layer.

Formation of an isolation microtrench by the inventive method is further illustrated in FIG. 2, wherein pad oxide layer 14 has been enlarged by local oxidation of silicon (LOCOS) to form a first field oxide 22. First field oxide 22 comprises a thin portion 24 adjacent to and touching lateral surface 20 of nitride layer 16, and a thick portion 26 that is generally at a location equidistant between neighboring patterned nitride layers 16.

Following formation of first field oxide 22, an etchback is carried out to expose a portion of semiconductor substrate 12. Etchback of first field oxide 22, illustrated in FIG. 3, causes a retraction of thin portion 24 of first field oxide 22 to form an exposed substrate area 28. Retraction of thin portion 24 of first field oxide 22 can be controlled by the inventive method to achieve exposed substrate area 28 that has a lateral dimension L that is less than currently achievable dimensions using photolithography. By the inventive method, exposed substrate area 28 has a lateral dimension L that in a range from about 50 Å to about 10,000 Å. As such, semiconductor structure 10 is ready for an isolation microtrench etch.

Figure 3:
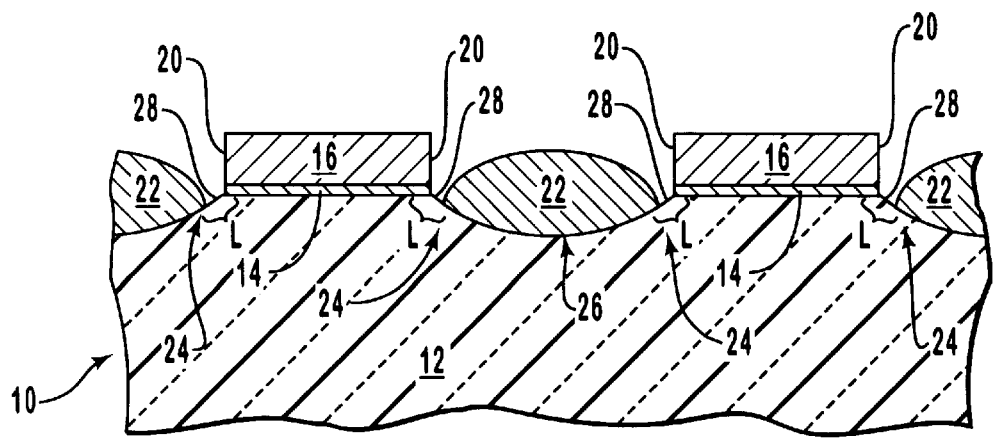
FIG. 3 is an elevational cross-section view of the semiconductor structure depicted in FIG. 2 after further processing, wherein a selective etch of the field oxide has caused the thin portion of the field oxide to retract away from the laterally exposed surface of the nitride layer, thereby exposing a portion of the semiconductor substrate that has an exposed width that is smaller than an exposed width that would be accomplishable by current photolithographic techniques.
Figure 4:
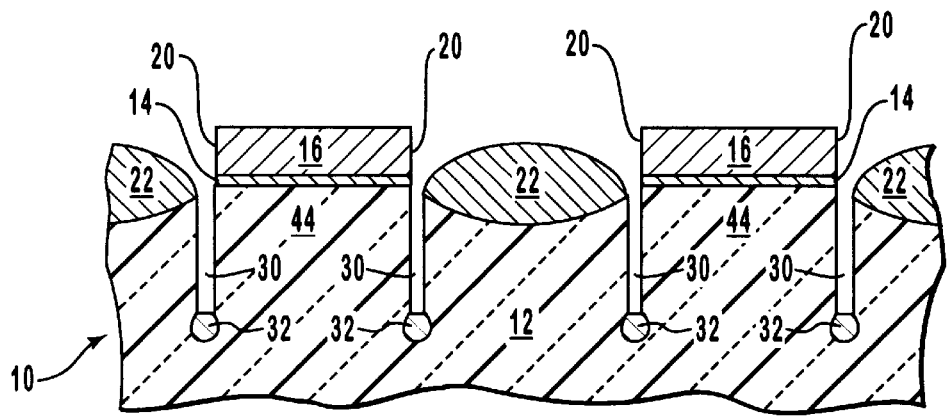
FIG. 4 illustrates an elevational cross-section view of the semiconductor structure depicted in FIG. 3 after further processing, wherein a microtrench has been etched into the semiconductor substrate and wherein the etch is self-aligned between the nitride layer and the field oxide at a width dimension that is smaller than that achievable by current photolithographic techniques.

FIG. 4 illustrates the results of an isolation microtrench etch according to the inventive method, wherein further processing of semiconductor structure 10 illustrated in FIG. 3 has been accomplished. In FIG. 4, it can be seen that a microtrench 30 has formed between first field oxide 22 and nitride layer 16. An etch recipe for the isolation microtrench etch is selective to both first field oxide 22 and nitride layer 16, thereby virtually etching only microtrench 30 and leaving first field oxide 22 and nitride layer 16 unetched.

With the inventive method, a width dimension for a microtrench that is smaller than 50 Å is achievable, but process limitations such as getting an oxide to fill into the narrow dimension of less than 50 Å become difficult. Additionally, microtrenches having a width that is the diameter of large atoms may cause electricity to travel from the active area, through some dielectric materials that fill the microtrench, and into other regions of the semiconductor structure.

Depending upon the depth of microtrench 30, it is an option of the inventive method to implant doping materials into the bottom of microtrench 30 to form a doped trench bottom 32. Preferably, implantation in this manner may be done, for example, when microtrench 30 is relatively shallow compared to the ultimate thickness of the field oxides that are situated on opposite sides of active areas of semiconductor structure 10.

The microtrench obtained by the inventive method overcomes the problems of the prior art of creating detrimental amounts of stress upon the semiconductive material of the active area, such as silicon. The inventive microtrench and its method of making result in combined width and depth dimensions that are substantially less than that of prior art trench. Moreover, the inventive microtrench applies substantially no detrimental amount of stress upon the semiconductive material of the active area.

Various materials may be used in the method of the present invention depending upon the specific application. Where the oxidation barrier is nitride layer 16 and first field oxide 22 is a thermal silicon oxide, the inventive method can be used to form a microtrench having a width in a range from about 100 Å to about 1,000 Å and a depth in a range from about 0.1 microns to about 0.25 microns, where the microtrench is situated in between neighboring nitride layers 16 separated by about 0.3 microns. For such a microtrench, there will be substantially no detrimental stress.

A simple dimensional analysis of microtrench aspect ratio (trench depth divided by trench width) compared to the aspect ratio of the active area (active area height divided by active area width) will assist the fabricator in determining what microtrench width is limiting to prevent detrimental amounts of stress upon the semiconductive material of the active area. It is noted that this simple ratio causes both trench depth and active area height to be cancelled because they are the same. Thus, a simple ratio of trench aspect ratio to active area aspect ratio comprises merely dividing one width by the other, for example dividing trench width by active area width. In the present invention it is considered to be a dimensional analysis guide for structures that avoid destructive stresses caused by trenches. For example, in a structure with a 0.3 micron distance between two adjacent nitride layers, a microtrench can be formed in an N-well region of a semiconductor substrate that has a width in a range from about 100 Å to about 1,000 Å, and a depth from about 0.1 microns to about 1 micron.

Figure 5:
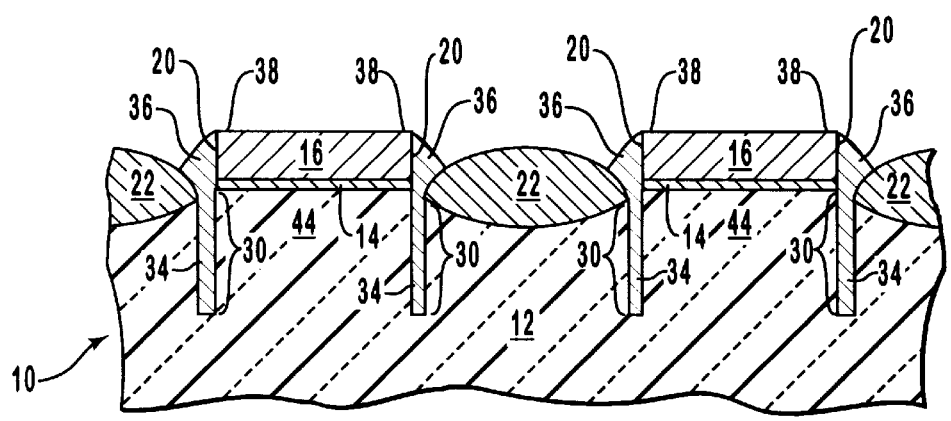
FIG. 5 is an elevational cross-section view of the semiconductor structure depicted in FIG. 4 after further processing, wherein the microtrench has been filled with a cover layer comprising either a layer of oxide or nitride that is deposited by chemical vapor deposition (CVD), or a thermally grown layer of oxide or nitride, and in which a second etch has removed all of the cover layer except for those portions filling the microtrench and forming a spacer upon the nitride layer.

The inventive method is further illustrated in FIG. 5, wherein microtrench 30 has been filled. Filling is accomplished either by oxide or nitride growth. Filling can also be accomplished by deposition of a dielectric material within microtrench 30. A filled microtrench 34 has a nitride spacer 36 thereover in contact with lateral surfaces 20 of nitride layer 16. The accomplishment of filled microtrench 34 according to the depiction in FIG. 5 is done, by way of non-limiting example, by chemical vapor deposition (CVD) of an oxide material such as from tetraethyl ortho silicate (TEOS), followed by an anisotropic etch to remove substantially all oxide upon first field oxide 22 and upon the upper surface 38 of nitride layer 16.

In one embodiment, the method of the present invention can be performed in an AME P5000 CVD chamber (available from Applied Materials Co., Santa Clara, Calif.). A TEOS (tetraethoxysilane) based silicon dioxide film is formed within microtrench 30 by standard CVD processes in the CVD chamber. Such standard CVD processes may include plasma enhanced CVD (PECVD), low pressure CVD (LPCVD), and thermal CVD (THCVD). The TEOS-based silicon dioxide film is formed by reacting TEOS and ozone in the CVD chamber, such as under the following conditions: 3900 sccm oxygen with 5% by weight ozone and 1500 sccm Helium saturated with TEOS (40° C. TEOS temperature), at 30 Torr and 400° C. Also, TEOS may be deposited in a vacuum process that may have a chamber pressure in a range from about 1,000 to 3,000 milliTorr. Alternatively, for TEOS formation, a high density plasma oxide deposition may be done. Alternatively, filled microtrench 34 may be a simple oxide or nitride growth to be grown selectively within microtrench 30, whereby growth is chosen chemically to selectively grow upon the exposed surfaces of semiconductor substrate 12 within microtrench 30.

Figure 6:
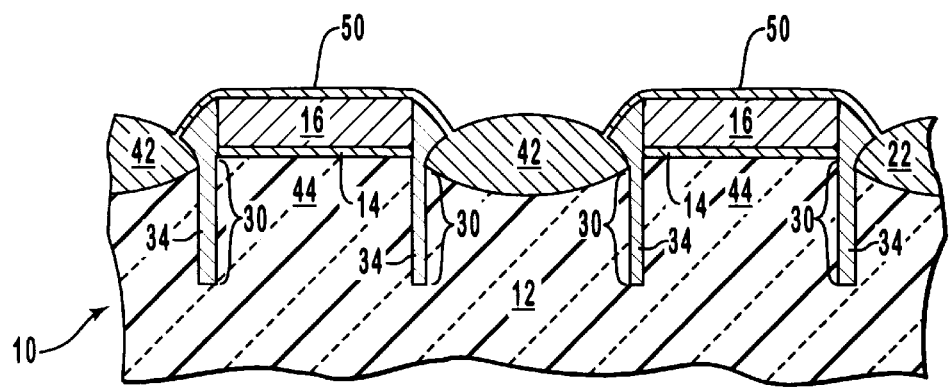
FIG. 6 is an elevational cross-section view of the semiconductor structure depicted in FIG. 5 after further processing, wherein the field oxide has been enlarged after a LOCOS process and in which a cap oxide has been formed upon the upper surface of the nitride layer.

Following formation of filled microtrench 34 with its optional formation of nitride spacer 36 upon nitride layer 16, a subsequent oxidation, illustrated in FIG. 6, is carried out whereby first field oxide 22 is further grown to form a second field oxide 42 that comprises a thicker field oxide layer than first field oxide 22. Second field oxide 42 encroaches downwardly into semiconductor substrate 12, however, encroachment of oxide into a semiconductor substrate active area 44 is substantially resisted by virtue of the presence of filled microtrench 34.

Figure 7:
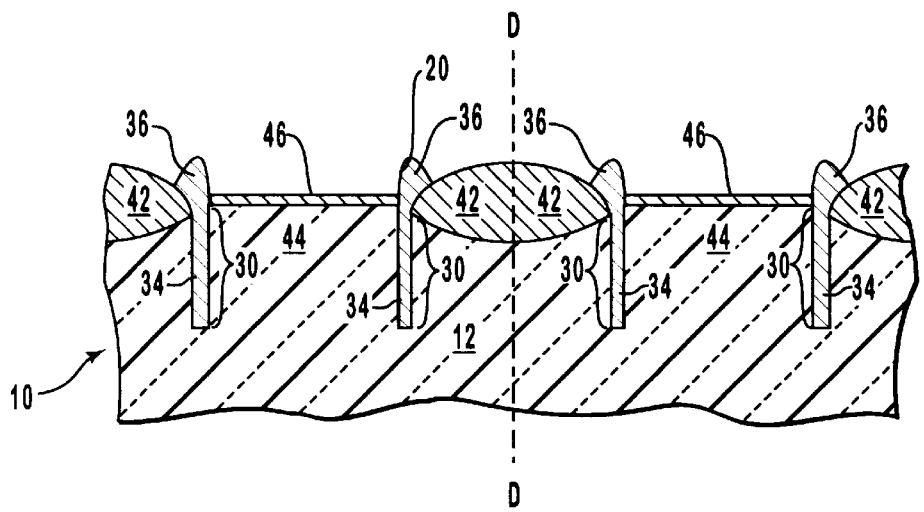
FIG. 7 is an elevational cross-section view of the semiconductor structure depicted in FIGS. 5 or 6 after further processing, wherein the cap oxide layer, the nitride layer, the pad oxide layer, and some of the portions of the nitride spacer have been removed by various steps, and wherein a gate oxide layer has been grown upon active areas of the semiconductor substrate thus forming a semiconductor structure with a nitride or oxide-filled microtrench.

FIG. 7 illustrates further processing of semiconductor structure 10 according to the inventive method, wherein a nitride etchback has removed nitride layer 16. Depending upon the etch recipe that is chosen, the portions of filled microtrench 34 and nitride spacer 36 may be partially removed or entirely removed as illustrated from left to right on opposite sides of dashed line D respectively in FIG. 7. Where filled microtrench 34 and nitride spacer 36 are an oxide such as silicon dioxide, the etch recipe that removes substantially all of nitride spacer 36 will also remove some of the exposed surface of second field oxide 42 as illustrated on the right side of dashed line D.

Following removal of nitride layer 16, various processing options are available. Where substantial contamination or oxidation of semiconductor substrate 12 may have occurred, and particularly contamination of active area 44, it may be preferable to grow a sacrificial oxide (SAC) layer into active area 44 and then to strip it, for example, using a 100:1 HF:deionized water strip. Where contamination or oxidation has not required formation of a SAC layer, a simple strip of pad oxide layer 14 may be carried out. Following removal of pad oxide layer 14, whether by SAC growth or simple stripping thereof, a gate oxide layer 46 seen in FIG. 7 is grown. Additionally, formation of a SAC layer may be carried out simultaneously with formation of filled microtrench 34, whereby a single oxidation is carried out, such as a thermal oxidation, followed by a strip of the SAC layer, optionally leaving the oxide in microtrench 30, and finally the formation of gate oxide layer 46.

Figure 8:
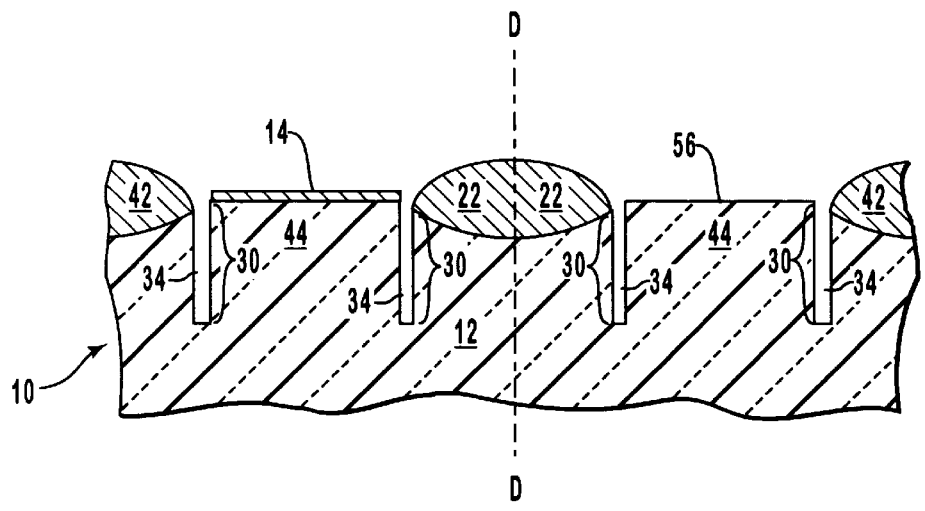
FIG. 8 is an elevational cross-section view of the semiconductor structure depicted in FIG. 4 after further processing in an alternative embodiment of the present invention, wherein the nitride layer and optionally the pad oxide layer have been removed prior to filling of the microtrench.
Figure 9:
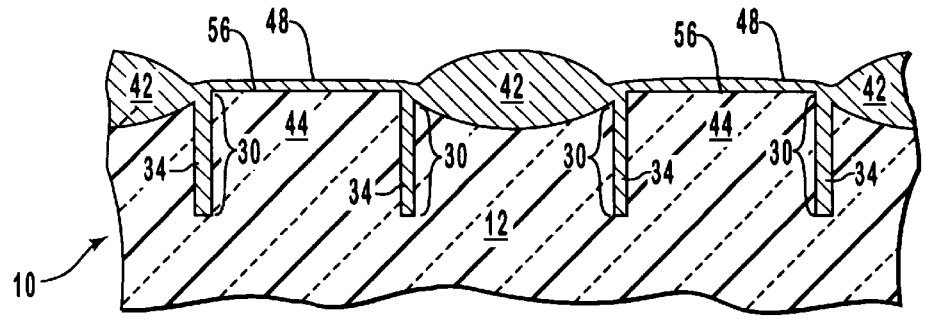
FIG. 9 illustrates an elevational cross-section of the semiconductor structure depicted in FIG. 8 after further processing, wherein the microtrench has been filled with an oxide layer that may comprise a sacrificial oxide layer or a deposited oxide layer, or wherein the microtrench has been filled with a nitride layer that may comprise a sacrificial nitride layer or a deposited nitride layer.

In yet another embodiment of the present invention, formation of microtrench 30 is carried out as illustrated in FIGS. 1–4, however, following formation of microtrench 30, nitride layer 16 is removed, for example by stripping. Stripping of nitride layer 16 is illustrated, as accomplished, in FIG. 8. In a first alternative of this embodiment of the present invention, pad oxide layer 14 is also stripped, as seen on the right side of dashed line D of FIG. 8, and a new oxide layer 48 seen in FIG. 9 is regrown that substantially covers all exposed surfaces of active area 44 including within microtrench 30. In a second alternative of this embodiment, nitride layer 16 is removed but pad oxide layer 14 is not. In either alternative of this embodiment, new oxide layer 48 will encroach into active area 44 approximately up to one-half the thickness of new oxide layer 48 as it forms upon an upper surface 56 of active area 44.

New oxide layer 48 may then be optionally removed by an etchback that is selective to active area 44 and semiconductor substrate 12, and this etchback may be carried out to remove substantially only those portions of new oxide layer 48 that lie upon upper surface 56, and not those portions that lie within microtrench 30.

Figure 10:
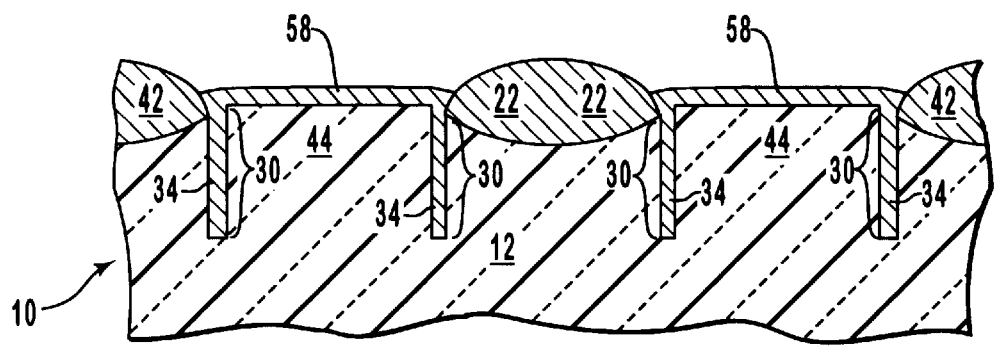
FIG. 10 illustrates an elevational cross-section of the semiconductor structure depicted in FIG. 8 after further processing, wherein the optional sacrificial layer has been removed and a gate oxide layer has been grown upon the active area of the semiconductor substrate, thus forming isolation microtrench-isolated active areas with a gate oxide thereupon.

Alternatively, as illustrated in FIG. 10, an etchback step may be carried out that removes substantially all of new oxide layer 48, both those portions that lie upon an upper surface 38 of second field oxide 42 and within microtrench 30. In this alternative embodiment, a nitride cover layer 58 is grown, deposited, or otherwise formed within microtrench 30 as a final isolation microtrench structure 34. Further thermal processing of semiconductor structure 10 may then be carried out, for example, to form second field oxide 42, and encroachment into active area 44 will be substantially resisted by the nitride material in microtrench 30.

In yet another embodiment of the present invention, microtrench formation is carried out by forming nitride layer 16 with mask 18 and then by performing an etch upon pad oxide layer 14. The structure depicted in FIG. 1 is a proper starting point for this embodiment of the present invention. Etching of pad oxide layer 14 is carried out according to the illustration depicted in FIG. 11. Etching of pad oxide layer 14 is carried out substantially uniformly at regions distant from lateral surface 20 of nitride layer 16.

The etchant is preferably selective to nitride layer 16 and does not substantially etch nitride layer 16, but rather concentrates the etch against lateral surface 20 of nitride layer 16 at the intersection with pad oxide layer 14 such that etching is accelerated at this location. Because of accelerated etching at this location, a breach having a width L forms in pad oxide layer 14 so as to form exposed substrate area 28. Preferably, the breach will be formed before pad oxide layer 14 is substantially penetrated. Width L has a width in a range from about 50 Å to about 10,000 Å, preferably from about 100 Å to about 2,000 Å, and most preferably from about 500 Å to about 1,000 Å. Control of the inventive etching method allows for the surface area of exposed substrate area 28 to be narrower than an exposed surface area otherwise achievable by conventional photolithography. The etch technique of this embodiment allows for an etch recipe that is selective to both pad oxide layer 14 and nitride layer 16. Although these are the only two surfaces that are initially exposed, once the breach is formed, accelerated etching occurs in silicon substrate 12 to form microtrench 30. A similar width L will be the width of microtrench 30.

The foregoing etch can be precisely controlled by known principles of etching to from a breach of a desired aperture or width in pad oxide layer 14. Specifically, it is known that at constant temperature, the mean free path of etchant molecules between collisions is inversely proportional to the pressure. It is also known that the path distance between collisions is substantially less than the mean free path for the etchant molecules against nitride layer 16 that collide downwardly and toward pad oxide layer 14 and that strike against nitride layer 16 at a height above pad oxide layer 14 because etching in a rebound region of these etching molecules will be substantially intensified. Given the foregoing principles of etching, a breach of a desired aperture or width in pad oxide layer 14 can thus be formed by controlling temperature and pressure during the etch thereof.

Figure 11:
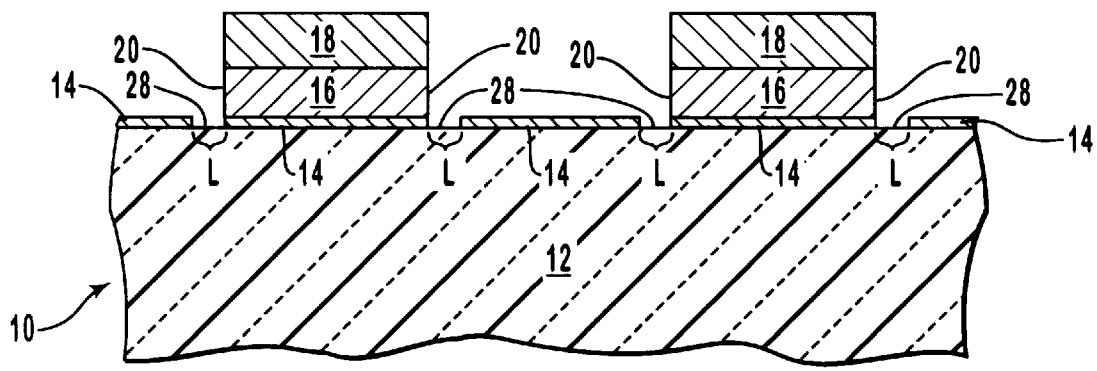
FIG. 11 illustrates an elevational cross-section of the semiconductor structure depicted in FIG. 1 after optional further processing, wherein a pad oxide layer etch that causes intensified etching effects against and next to the nitride layer has created a breach within the pad oxide layer at a width dimension smaller than that achievable by current photolithographic techniques.
Figure 12:
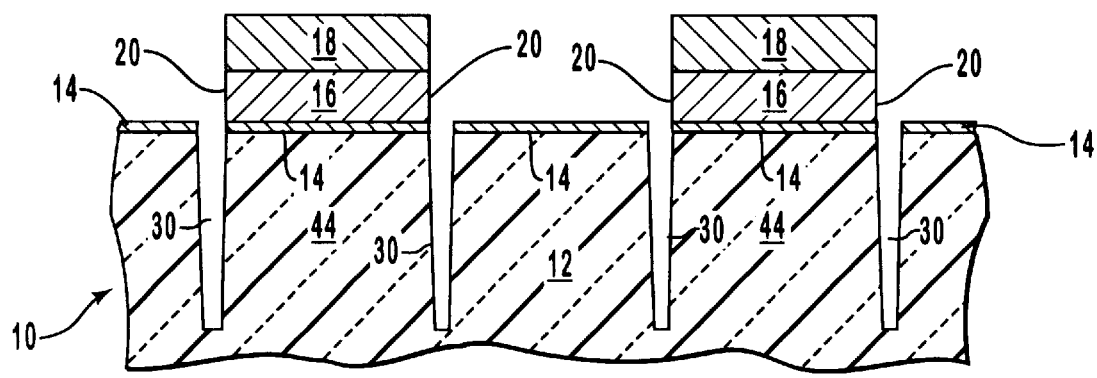
FIG. 12 illustrates an elevational cross-section of the semiconductor structure depicted in FIG. 11 after further processing, wherein a microtrench has been etched into the semiconductor substrate and wherein the etch is self-aligned between the nitride layer and the edge of the unbreached portion of the pad oxide layer at a width dimension that is smaller than that achievable by current photolithographic techniques.

Although etching of pad oxide layer 14 may continue after formation of exposed substrate area 28 with a single pad oxide layer 14 and nitride layer 16 selective etch recipe, as illustrated in FIG. 11, a preferred alternative of this embodiment comprises exchanging the etch recipe from that which was employed to etch exposed surface area 28 to an etch recipe that is highly selective to pad oxide layer 14 and nitride layer 16. As such, etching with a changed etch recipe will form a microtrench 30, as seen in FIG. 12, that is confined to the size of the breach that is entirely within exposed substrate area 28 as illustrated in FIG. 11.

Figure 13:
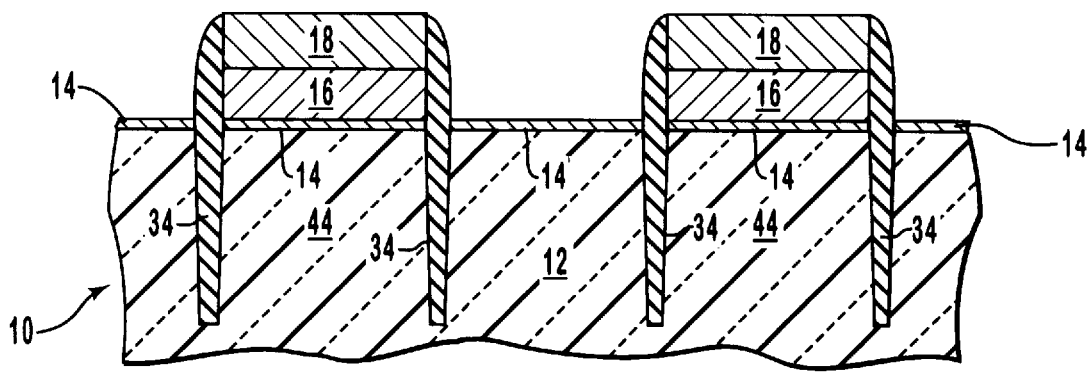
FIG. 13 is an elevational cross-section view of the semiconductor structure depicted in FIG. 12 after further processing, wherein the microtrench has been filled with a cover layer of either a CVD oxide or a nitride, or wherein the microtrench has been filled with a thermally grown oxide or nitride, and in which a second etch has removed all of the cover layer except for those portions filling the microtrench and forming a spacer upon the nitride layer.

Following formation of microtrench 30, mask 18 is removed by conventional stripping as seen in FIG. 13. As an alternative means of removing mask 18, thermal removal of mask 18 can be carried out simultaneously to the forming of filled microtrench 34. In this alternative technique, thermal processing effectively drives off mask 18 by causing the components of mask 18 to volatilize, while the enhanced temperatures and the presence of oxygen used for thermal mask removal cause oxidation within microtrench 30. In an alternative technique of this embodiment, removal of mask 18 is followed by oxidation that also forms an oxide cap 50 upon nitride layer 16 as analogously illustrated in FIG. 6.

Figure 14:
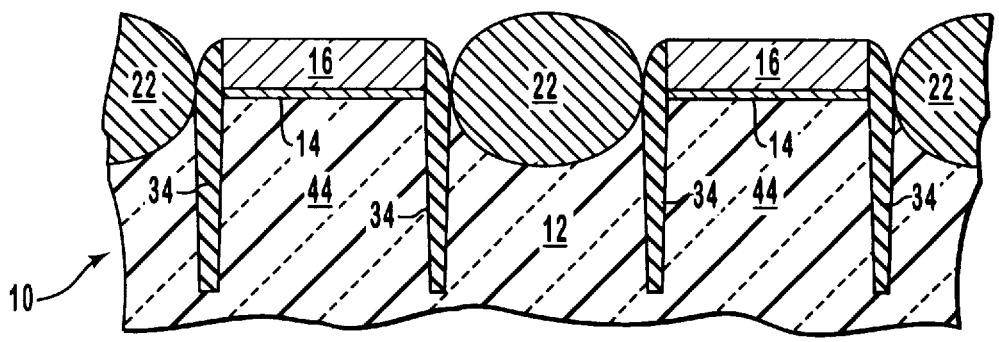
FIG. 14 is an elevational cross-section view of the semiconductor structure depicted in FIG. 13 after further processing, wherein the field oxide has been enlarged after a LOCOS process.
Figure 15:
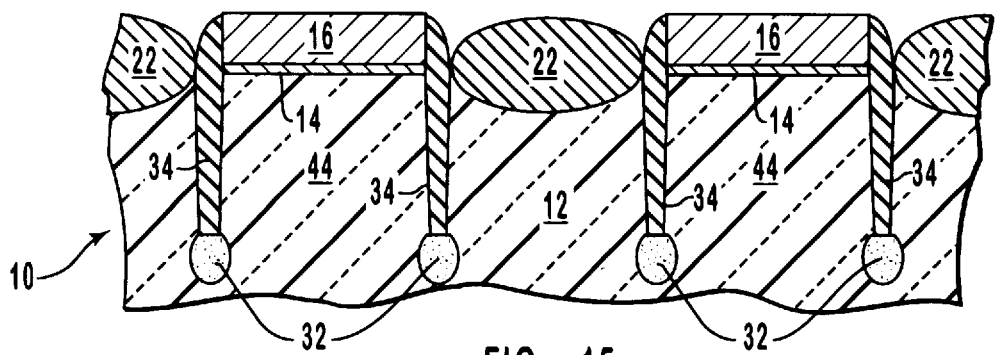
FIG. 15 is an elevational cross-section view of the semiconductor structure depicted in FIG. 11 after further processing, wherein a microtrench that is shallower than that depicted in FIG. 12 has been etched and filled according the methods of the present invention.

Because oxidation within microtrench 30 can be followed by several steps of oxidation, for example SAC layer oxidation, encroachment into active area 44 may continue. In a preferred technique, microtrench 30 is filled by the formation of a nitride layer (not shown) which is followed by an anisotropic spacer etch to form filled microtrench 34 and nitride spacer 36. After formation of a nitride within microtrench 30, a subsequent oxidation of semiconductor structure 10 allows for growth of pad oxide layer 14 into a field oxide region, such as first field oxide 22 seen in FIG. 14. Encroachment, however, of oxide into active area 44 is substantially resisted by virtue of formation of nitride cover layer 58 that form filled microtrench 34.

Where microtrench 30 is shallow, meaning that first field oxide 22 encroaches substantially no deeper into semiconductor substrate 12 than the bottom of microtrench 30, formation of first field oxide 22 can be carried out without any substantial encroachment into active area 44, as illustrated in FIG. 15. Following formation of first field oxide 22, a dry etch decap may be carried out to remove any oxide, any nitride, or the like that may have formed upon upper surface 38 of nitride layer 16.

Figure 16:
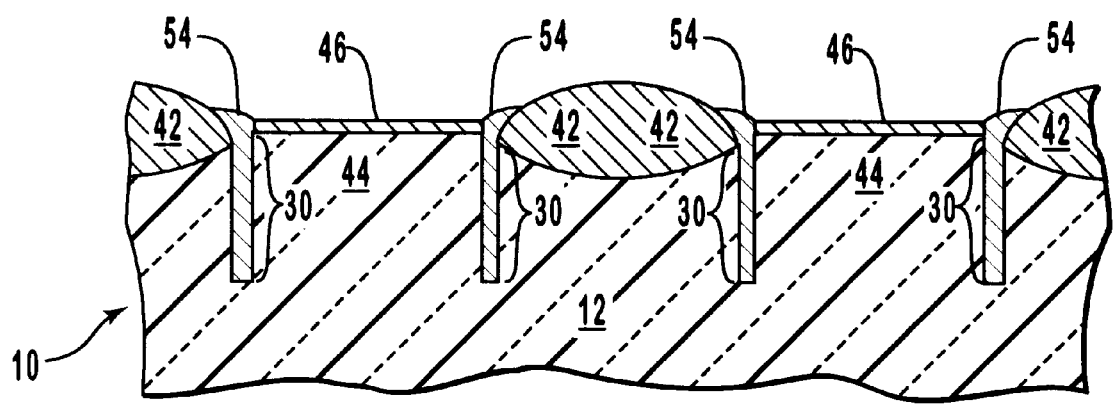
FIG. 16 is an elevational cross-section view of the semiconductor structure depicted in FIG. 15 after further processing, wherein material has been removed from the microtrenches and replaced with another material of a composition different from that of the first material that previously filled the microtrenches.

Following a dry etch decap, a wet nitride etch is carried out to substantially remove all exposed nitride upon semiconductor structure 10, which includes the nitride in microtrench 30 and nitride layer 16. The wet nitride etch recipe is highly selective to first field oxide 22 and to pad oxide layer 14. With removal of all nitride within filled microtrench 34, an oxide may be grown in the stead of filled microtrench 34 to form a field oxide spacer 54 seen in FIG. 16 that substantially fills microtrench 30 and coats first field oxide 22 as it converts into second field oxide 42.

Following formation of field oxide spacer 54, a sacrificial oxide layer formation and removal technique may be carried out to remove pad oxide layer 14, or a simple etchback may be carried out that removes incidental portions of second field oxide 42 and field oxide spacer 54. Following these optional processes, gate oxide layer 46 may be formed to cover active area 44.

In microtrench formation according to the present invention, a composite filled microtrench 34 and nitride spacer 36 may be fabricated, whether it be a self-aligned microtrench formed between an edge of first field oxide layer 22 and nitride layer 16, or between pad oxide layer 14 and nitride layer 16. The inventive method may be practiced by forming a first cover layer comprising an oxide in microtrench 30 and upon nitride layer 16, followed by an etch, for example a wet isotropic etch, that removes all of the oxide cover layer except for those portions within microtrench 30. Following removal of the oxide cover layer except for those portions within microtrench 30, a second cover layer comprising a nitride film is formed upon both nitride layer 16 and first field oxide 22. A second etch, by way of non-limiting example an anisotropic etch, removes portions of the second cover layer to leave nitride spacer 36 above filled microtrench 34 and upon nitride layer 16.

The purpose of forming a composite nitride spacer 36 and filled microtrench 34 is to achieve an easily formed isolation material in microtrench 30, such as a thermal oxide that forms filled microtrench 34, followed by a nitride cap comprising nitride spacer 36 as the material above filled microtrench 34. With the nitride cap comprising nitride spacer 36 as the material above filled microtrench 34, further oxidation, for example of first field oxide 22 to form second field oxide 42, can be carried out. Encroachment into active area 44 by oxide material through filled microtrench 34, which in this technique is an oxide, is substantially resisted by the nitride cap which is nitride spacer 36 above filled microtrench 34. As in techniques set forth above, etching may be carried out to either partially or to totally remove nitride spacer 36 following thermal processing.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming a semiconductor structure comprising:

forming a pad oxide layer upon a semiconductor substrate;

forming an oxidation barrier layer upon said pad oxide layer;

selectively removing portions of said oxidation barrier layer to form a lateral surface thereon and to expose selected areas of said pad oxide layer;

forming a field oxide in the exposed selected areas of said pad oxide layer, said field oxide including a first portion having about the thickness of said pad oxide layer that touches said lateral surface of said oxidation barrier layer;

selectively removing said first portion of said field oxide at an edge thereof to expose a portion of said semiconductor substrate;

forming a trench within said semiconductor substrate in contact with and beneath the exposed portion of said semiconductor substrate, said trench being situated between said oxidation barrier layer and said field oxide;

forming a cover layer, composed of a material selected from a group consisting of oxide and nitride, within said trench and upon said oxidation barrier:

selectively removing said cover layer to form a spacer upon said lateral surface of said oxidation barrier layer; and enlarging said field oxide.

2. A method of forming a semiconductor structure according to claim 1, wherein said oxidation barrier layer comprises a nitride layer.

3. A method of forming a semiconductor structure according to claim 1 further comprising:

forming a cover layer within said trench and upon said oxidation barrier;

selectively removing said cover layer to form a spacer upon said lateral surface of said oxidation barrier layer; and enlarging said field oxide.

4. A method of forming a semiconductor structure according to claim 3, wherein said cover layer comprises a CVD oxide.

5. A method of forming a semiconductor structure according to claim 3, wherein said cover layer comprises a plasma enhanced CVD oxide.

6. A method of forming a semiconductor structure according to claim 3, wherein said cover layer comprises a low pressure CVD oxide.

7. A method of forming a semiconductor structure according to claim 3, wherein said cover layer comprises a thermal CVD oxide.

8. A method of forming a semiconductor structure according to claim 4, further comprising:

etching said CVD oxide to expose said oxidation barrier layer;

removing said oxidation barrier layer and said pad oxide layer to expose a portion of said semiconductor substrate; and forming a gate oxide layer upon said exposed portion of said semiconductor substrate.

9. A method of forming a semiconductor structure according to claim 3, wherein said cover layer comprises a CVD nitride.

10. A method of forming a semiconductor structure according to claim 3, wherein said cover layer comprises a plasma enhanced CVD nitride.

11. A method of forming a semiconductor structure according to claim 3, wherein said cover layer comprises a low pressure CVD nitride.

12. A method of forming a semiconductor structure according to claim 3, wherein said cover layer comprises a thermal CVD nitride.

13. A method of forming a semiconductor structure according to claim 9, further comprising:

etching said CVD nitride to expose said oxidation barrier layer;

removing said oxidation barrier layer and said pad oxide layer to expose a portion of said semiconductor substrate; and forming a gate oxide layer upon said exposed portion of said semiconductor substrate.

14. A method of forming a semiconductor structure according to claim 3, wherein said cover layer comprises a thermally grown oxide.

15. A method of forming a semiconductor structure according to claim 14, further comprising:

etching said thermally grown oxide to expose said oxidation barrier layer;

removing said oxidation barrier layer and said pad oxide layer to expose a portion of said semiconductor substrate; and forming a gate oxide layer upon said exposed portion of said semiconductor substrate.

16. A method of forming a semiconductor structure according to claim 3, wherein said cover layer comprises a thermally grown nitride.

17. A method of forming a semiconductor structure according to claim 16, further comprising:

etching said thermally grown oxide to expose said oxidation barrier layer;

removing said oxidation barrier layer and said pad oxide layer to expose a portion of said semiconductor substrate; and forming a gate oxide layer upon said exposed portion of said semiconductor substrate.

18. A method of forming a semiconductor structure comprising:

forming a pad oxide layer upon a semiconductor substrate;

forming an oxidation barrier layer upon said pad oxide layer;

selectively removing portions of said oxidation barrier layer to form a lateral surface thereon and to expose selected areas of said pad oxide layer;

forming a field oxide in the exposed selected areas of said pad oxide layer, said field oxide including a first portion having about the thickness of said pad oxide layer that touches said lateral surface of said oxidation barrier layer;

selectively removing said first portion of said field oxide at an edge thereof to expose a portion of said semiconductor substrate; and forming a trench within said semiconductor substrate in contact with and beneath the exposed portion of said semiconductor substrate, said trench being situated between said oxidation barrier layer and said field oxide;

forming a cover layer within said trench and upon said oxidation barrier;

selectively removing said cover layer to form a spacer upon said lateral surface of said oxidation barrier layer; and enlarging said field oxide;

removing any oxide and any nitride upon an upper surface of said oxidation barrier layer formed during enlarging of said field oxide;

removing said oxidation barrier layer and said pad oxide layer to expose a portion of said semiconductor substrate; and forming a gate oxide layer upon said exposed portion of said semiconductor substrate.

19. A method of forming a semiconductor structure comprising:

forming a pad oxide layer upon a semiconductor substrate;

forming an oxidation barrier layer upon said pad oxide layer;

selectively removing portions of said oxidation barrier layer to form a lateral surface thereon and to expose selected areas of said pad oxide layer;

forming a field oxide in the exposed selected areas of said pad oxide layer, said field oxide including a first portion having about the thickness of said pad oxide layer that touches said lateral surface of said oxidation barrier layer;

selectively removing said first portion of said field oxide at an edge thereof to expose a portion of said semiconductor substrate; and forming a trench within said semiconductor substrate in contact with and beneath the exposed portion of said semiconductor substrate, said trench being situated between said oxidation barrier layer and said field oxide;

removing said oxidation barrier layer;

forming a sacrificial oxide layer from said pad oxide layer aid within said trench; and removing said sacrificial oxide from said pad oxide layer to expose a portion of said semiconductor substrate; and forming a gate oxide layer upon said exposed portion of said semiconductor substrate.

20. A method of forming a semiconductor substrate comprising:

forming a pad oxide layer upon a semiconductor substrate;

forming an oxidation barrier layer upon said pad oxide layer;

selectively removing portions of said oxidation barrier layer to form a lateral surface thereon and to expose selected areas of said pad oxide layer;

forming a field oxide in the exposed selected areas of said pad oxide layer, said field oxide including a first portion having about the thickness of said pad oxide layer that touches said lateral surface of said oxidation barrier layer;

selectively removing said first portion of said field oxide at an edge thereof to expose a portion of said semiconductor substrate; and forming a trench within said semiconductor substrate in contact with and beneath the exposed portion of said semiconductor substrate, said trench being situated between said oxidation barrier layer and said field oxide;

forming a first cover layer of a first material in said trench and upon said oxidation barrier;

selectively removing said firs cover layer from said oxidation barrier;

forming a second cover layer of a second material upon said oxidation barrier; and selectively removing said second cover layer to form a spacer upon said lateral surface of said oxidation barrier.

21. A method of forming a semiconductor structure according to claim 20, wherein said first material comprises an oxide and said second material comprises a nitride.

22. A method of forming a semiconductor structure according to claim 20, wherein said selectively removing said first cover layer comprises wet etching and wherein selectively removing said second cover layer comprises anisotropic etching.

23. A method of forming a semiconductor structure comprising:

forming a pad oxide layer upon a semiconductor substrate;

forming an oxidation barrier layer upon said pad oxide layer;

selectively removing portions of said oxidation barrier layer to form a lateral surface thereon and to expose selected areas of said pad oxide layer;

forming a field oxide in the exposed selected areas of said pad oxide layer, said field oxide including a first portion having about the thickness of said pad oxide layer that touches said lateral surface of said oxidation barrier layer;

selectively removing said first portion of said field oxide at an edge thereof to expose a portion of said semiconductor substrate; and forming a trench within said semiconductor substrate in contact with and beneath the exposed portion of said semiconductor substrate, said trench being situated between said oxidation barrier layer and said field oxide;

removing said oxidation barrier layer and said pad oxide layer to expose a portion of said semiconductor substrate; and forming a cover layer in said trench and upon the exposed portion of said semiconductor substrate by forming a sacrificial oxide layer upon said semiconductor substrate above said trench and within said trench and removing said sacrificial oxide layer above said trench.

24. A method of forming a semiconductor structure comprising:

forming a pad oxide layer upon a semiconductor substrate;

forming an oxidation barrier layer upon said pad oxide layer;

selectively removing portions of said oxidation barrier layer to form a lateral surface thereon and to expose selected areas of said pad oxide layer;

forming a field oxide in the exposed selected areas of said pad oxide layer, said field oxide including a first portion having about the thickness of said pad oxide layer that touches said lateral surface of said oxidation barrier layer;

selectively removing said first portion of said field oxide at an edge thereof to expose a portion of said semiconductor substrate; and forming a trench within said semiconductor substrate in contact with and beneath the exposed portion of said semiconductor substrate, said trench being situated between said oxidation barrier layer and said field oxide;

removing said oxidation barrier layer and said pad oxide layer to expose a portion of said semiconductor substrate; and forming a cover layer in said trench and upon the exposed portion of said semiconductor substrate by forming the cover layer in said trench comprises forming a sacrificial oxide layer upon said semiconductor substrate substantially above said trench and within said trench and removing said sacrificial oxide layer.

25. A method of forming a semiconductor structure according to claim 24, further comprising:
forming a nitride layer within said trench; and
enlarging said field oxide.

26. A method of forming a semiconductor structure comprising:
forming a pad oxide layer upon a semiconductor substrate;
forming an oxidation barrier layer upon said pad oxide layer;
selectively removing portions of said oxidation barrier layer to form a lateral surface thereon and to expose selected areas of said pad oxide layer;
forming a field oxide in the exposed selected areas of said pad oxide layer, said field oxide including a first portion having about the thickness of said pad oxide layer that touches said lateral surface of said oxidation barrier layer;
selectively removing said first portion of said field oxide at an edge thereof to expose a portion of said semiconductor substrate; and
forming a trench within said semiconductor substrate in contact with and beneath the exposed portion of said semiconductor substrate, said trench being situated between said oxidation barrier layer and said field oxide;
removing said oxidation barrier layer;
forming a cover layer in said trench and upon said pad oxide layer;
selectively removing a portion said cover layer that is upon said pad oxide layer; and
enlarging said field oxide.

27. A method of forming a semiconductor structure according to claim 26, wherein said cover layer comprises a CVD oxide.

28. A method of forming a semiconductor structure according to claim 26, wherein said cover layer comprises a CVD nitride.

29. A method of forming a semiconductor structure according to claim 26, wherein said cover layer comprises a thermally grown oxide.

30. A method of forming a semiconductor structure according to claim 26, wherein said cover layer comprises a thermally grown nitride.

31. A method of forming a semiconductor trench comprising:
forming a pad oxide layer upon an active area of a semiconductor substrate;
forming a nitride layer upon said pad oxide layer;
patterning said nitride layer to form a lateral surface thereon that is substantially orthoganol to said semiconductor substrate, and to expose selected areas of said pad oxide layer;
forming a field oxide in the exposed selected areas of said pad oxide layer, said field oxide including a first portion having about the thickness of said pad oxide layer that touches said lateral surface of said nitride layer;
selectively etching said field oxide to recede said first portion of said field oxide and to expose a portion of said semiconductor substrate;
forming a trench in contact with and beneath the exposed portion of said semiconductor substrate that is between said oxidation barrier layer and said field oxide;
forming a cover layer in said trench and upon said oxidation barrier;
etching said cover layer to form a spacer upon said lateral surface of said nitride layer;
enlarging said field oxide;
removing any oxide and any nitride that is upon an upper surface of said nitride layer;
removing said nitride layer and said pad oxide layer; and
forming a gate oxide layer upon said active area.

32. A method of forming a semiconductor structure comprising:
forming a pad oxide layer upon a semiconductor substrate;
forming an oxidation barrier layer upon said pad oxide layer;
patterning said oxidation barrier layer to form a lateral surface thereon and to expose selected areas of said pad oxide layer;
etching a portion of said exposed selected areas of said pad oxide layer to form a breach therein against said lateral surface of said oxidation barrier layer;
forming a trench through the breach into the semiconductor substrate;
forming a cover layer in said trench, upon said oxidation barrier, and upon said pad oxide layer;
etching said cover layer to form a re-exposed pad oxide layer and to form a spacer upon said lateral surface of said oxidation barrier; and
forming a field oxide by enlarging said pad oxide layer.

33. A method of forming a semiconductor structure according to claim 32, wherein said oxidation barrier layer comprises a nitride layer.

34. A method of forming a semiconductor structure according to claim 32, wherein said breach in said pad oxide layer 14 has a width in a range from about 50 Å to about 2,000 Å.

35. A method of forming a semiconductor structure according to claim 32, wherein said cover layer comprises a CVD oxide.

36. A method of forming a semiconductor structure according to claim 35, further comprising:
etching said CVD oxide to expose said oxidation barrier layer;
removing said oxidation barrier layer and said pad oxide layer to expose a portion of the semiconductor substrate; and
forming a gate oxide layer upon the exposed portion of the semiconductor substrate.

37. A method of forming a semiconductor structure according to claim 32, wherein said cover layer comprises a CVD nitride.

38. A method of forming a semiconductor structure according to claim 37, further comprising:

etching said CVD nitride to expose said oxidation barrier layer and said trench;

removing said oxidation barrier layer and said pad oxide layer to expose a portion of the semiconductor substrate; and forming a gate oxide layer upon the exposed portion of the semiconductor substrate.

39. A method of forming a semiconductor structure according to claim 38, wherein said removing said oxidation barrier layer and said pad oxide layer comprises:

etching said oxidation barrier layer and said CVD nitride;

forming an oxide layer within said trench and upon said field oxide; and removing said pad oxide layer.

40. A method of forming a semiconductor structure according to claim 32, wherein said cover layer comprises a thermally grown oxide.

41. A method of forming a semiconductor structure according to claim 40, further comprising:

etching said thermally grown oxide to expose said oxidation barrier layer;

removing said oxidation barrier layer and said pad oxide layer to expose a portion of the semiconductor substrate; and forming a gate oxide layer upon the exposed portion of the semiconductor substrate.

42. A method of forming a semiconductor structure according to claim 32, wherein said cover layer comprises a thermally grown nitride.

43. A method of forming a semiconductor structure according to claim 42, further comprising:

etching said thermally grown nitride to expose said oxidation barrier layer;

removing said oxidation barrier layer and said pad oxide layer to expose a portion of the semiconductor substrate; and forming a gate oxide layer upon the exposed portion of the semiconductor substrate.

44. A method of forming a semiconductor substrate comprising:

forming a pad oxide layer upon a semiconductor substrate;

forming an oxidation barrier layer upon said pad oxide layer;

patterning said oxidation barrier layer to form a lateral surface thereon and to expose selected areas of said pad oxide layer;

etching a portion of said exposed selected areas of said pad oxide layer to form a breach therein in against said lateral surface of said oxidation barrier layer;

forming a trench through the breach into the semiconductor substrate;

forming a first cover layer of a first material in said trench and upon said oxidation barrier;

etching to remove said first cover layer from said oxidation barrier;

forming a second cover layer of a second material upon said oxidation barrier; and etching said second cover layer to form a spacer upon said lateral surface of said oxidation barrier.

45. A method of forming a semiconductor structure according to claim 44, wherein said first material comprises an oxide and said second material comprises a nitride.

46. A method of forming a semiconductor structure according to claim 44, wherein said etching to remove said first cover layer comprises wet etching and wherein said etching said second cover layer comprises anisotropic etching.

47. A method of forming a semiconductor structure comprising:

forming a pad oxide layer upon a semiconductor substrate;

forming an nitride layer upon said pad oxide layer;

patterning said nitride layer to form a lateral surface thereon that is substantially orthoganol to said semiconductor substrate, and to expose selected areas of said pad oxide layer;

etching said exposed selected areas of said pad oxide layer to form a trench therein against said lateral surface of said nitride layer;

forming a nitride film cover layer in said trench, upon said nitride layer, and upon said pad oxide layer;

etching said cover layer to form a reexposed pad oxide layer and to form a spacer upon said lateral surface of said nitride layer;

forming a field oxide by enlarging said pad oxide layer;

removing said nitride layer and said pad oxide layer to expose a portion of the semiconductor substrate; and forming a gate oxide layer upon the exposed portion of the semiconductor substrate.

48. A method of forming an isolation trench in a semiconductor structure that includes a pad oxide layer upon a semiconductor substrate and an oxidation barrier layer upon the pad oxide layer, wherein the oxidation barrier layer has an exposed lateral surface thereon and the pad oxide layer has an exposed area thereon, the method comprising:

forming a field oxide in the exposed area of the pad oxide layer;

selectively removing a portion of the field oxide to expose a portion of the semiconductor substrate;

forming a trench extending between the oxidation barrier layer and the field oxide and extending within and beneath the exposed portion of said semiconductor substrate;

filling the trench with a dielectric material selected from a group consisting of oxide and nitride;

forming a spacer from the dielectric material upon the lateral surface of the oxidation barrier layer; and enlarging the field oxide.

* * * * *

UNITED STATES PATENT AND TRADEMARK OFFICE
CERTIFICATE OF CORRECTION

PATENT NO.   : 6,090,685
DATED        : July 18, 2000
INVENTOR(S)  : Fernando Gonzalez, Mike Violette, Nanseng Jeng, Aftab Ahmad, Klaus Schuegraf It is certified that error appears in the above-identified patent and that said Letters Patent is hereby corrected as shown below:

Title page,
Inventors, please change "Gonzales" to -- Gonzalez --
Inventors, please change "Chandler" to -- Fountain Hills --

Column 2,
Line 66, please change "layer The" to -- layer. The --

Column 7,
Line 2, please change "invention it" to -- invention, it --

Column 17,
Line 57, please change "therein in against" to -- therein against --

Signed and Sealed this

Sixth Day of November, 2001

*Attest:*

NICHOLAS P. GODICI
*Attesting Officer*   Acting Director of the United States Patent and Trademark Office